United States Patent
Subrahmanyan et al.

(10) Patent No.: US 12,354,973 B2
(45) Date of Patent: Jul. 8, 2025

(54) STRESS AND OVERLAY MANAGEMENT FOR SEMICONDUCTOR PROCESSING

(71) Applicant: Applied Materials, Inc., Santa Clara, CA (US)

(72) Inventors: Pradeep K. Subrahmanyan, Cupertino, CA (US); Sean S. Kang, San Ramon, CA (US); Sony Varghese, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 569 days.

(21) Appl. No.: 17/730,527

(22) Filed: Apr. 27, 2022

(65) Prior Publication Data
US 2022/0344282 A1    Oct. 27, 2022

Related U.S. Application Data

(60) Provisional application No. 63/180,645, filed on Apr. 27, 2021.

(51) Int. Cl.
*H01L 23/00* (2006.01)
*G03F 7/00* (2006.01)
*H01L 21/66* (2006.01)

(52) U.S. Cl.
CPC ........ *H01L 23/562* (2013.01); *G03F 7/70633* (2013.01); *G03F 7/7065* (2013.01); *H01L 22/12* (2013.01)

(58) Field of Classification Search
CPC ... H01L 23/562; H01L 22/12; G03F 7/70633; G03F 7/7065
See application file for complete search history.

(56) References Cited

U.S. PATENT DOCUMENTS

| | | | |
|---|---|---|---|
| 6,616,767 B2 * | 9/2003 | Zhao | H01L 21/67103 392/416 |
| 7,298,941 B2 * | 11/2007 | Palen | G02B 6/423 264/1.24 |
| 7,679,069 B2 * | 3/2010 | Adel | G03F 7/706 250/492.1 |
| 9,847,221 B1 | 12/2017 | McLaughlin et al. | |
| 10,020,204 B2 * | 7/2018 | Ranish | H01L 21/68 |

(Continued)

FOREIGN PATENT DOCUMENTS

| | | | | |
|---|---|---|---|---|
| CN | 108352298 B | * | 4/2023 | ........ H01J 37/32009 |
| CN | 117223088 A | * | 12/2023 | ......... C23C 14/0652 |

(Continued)

OTHER PUBLICATIONS

PCT International Search Report and Written Opinion in PCT/US2022/026465 dated Aug. 26, 2022, 11 pages.

(Continued)

*Primary Examiner* — Laura M Menz
(74) *Attorney, Agent, or Firm* — SERVILLA WHITNEY LLC

(57) ABSTRACT

Provided are methods of reducing the stress of a semiconductor wafer. A wafer map of a free-standing wafer is created using metrology tools. The wafer map is then converted into a power spectral density (PSD) using a spatial frequency scale. The fundamental component of bow is then compensated with a uniform film, e.g., silicon nitride (SiN), deposited on the back side of the wafer.

13 Claims, 3 Drawing Sheets

(56) References Cited

U.S. PATENT DOCUMENTS

| | | | |
|---|---|---|---|
| 10,128,197 B2* | 11/2018 | Ranish | H01L 21/68742 |
| 10,410,979 B2 | 9/2019 | Hua et al. | |
| 10,622,233 B2* | 4/2020 | Hooge | H01L 22/20 |
| 11,094,647 B2* | 8/2021 | Sheng | H01L 21/0217 |
| 11,666,950 B2* | 6/2023 | Lee | C23C 16/45523 |
| | | | 134/22.1 |
| 2004/0041102 A1 | 3/2004 | Kamm | |
| 2006/0239605 A1* | 10/2006 | Palen | G02B 6/423 |
| | | | 385/33 |
| 2011/0144943 A1 | 6/2011 | Veeraraghavan et al. | |
| 2013/0089935 A1 | 4/2013 | Vukkadala et al. | |
| 2016/0371423 A1 | 12/2016 | Vukkadala et al. | |
| 2017/0133328 A1* | 5/2017 | Ranish | H01L 21/6831 |
| 2017/0162456 A1 | 6/2017 | Owen | |
| 2017/0263466 A1* | 9/2017 | Ranish | H01L 21/67167 |
| 2018/0076385 A1 | 3/2018 | Fuji et al. | |
| 2018/0090307 A1 | 3/2018 | Brunner et al. | |
| 2018/0364579 A1* | 12/2018 | Tsai | G03F 7/70783 |
| 2019/0304784 A1* | 10/2019 | Pawashe | H01L 21/2007 |
| 2020/0098702 A1* | 3/2020 | Sheng | C23C 16/26 |
| 2020/0118822 A1* | 4/2020 | Falk | H01L 21/322 |
| 2022/0344282 A1* | 10/2022 | Subrahmanyan | H01L 22/12 |
| 2023/0367941 A1* | 11/2023 | Subrahmanyan | H01L 21/302 |

FOREIGN PATENT DOCUMENTS

| | | | | |
|---|---|---|---|---|
| JP | 2018041080 A | 3/2018 | | |
| JP | 2018536990 A | 12/2018 | | |
| JP | 2020021076 A | 2/2020 | | |
| JP | 7164289 B2 * | 11/2022 | | G03F 7/70525 |
| KR | 20180069920 A | 6/2018 | | |
| WO | 2020021076 A1 | 1/2020 | | |
| WO | 2020038642 A1 | 2/2020 | | |
| WO | 2020226855 A1 | 11/2020 | | |
| WO | WO-2022232224 A1 * | 11/2022 | | C23C 14/0652 |
| WO | WO-2023219982 A1 * | 11/2023 | | G06F 30/39 |

OTHER PUBLICATIONS

Brunner, et al., "Characterization of wafer geometry and overlay error on silicon wafers with nonuniform stress", J. Micro/Nanolith. MEMS MOEMS, Oct.-Dec. 2013/vol. 12(4), 13 pages.

* cited by examiner

STRESS AND OVERLAY MANAGEMENT FOR SEMICONDUCTOR PROCESSING

CROSS-REFERENCE TO RELATED APPLICATION

This application claims priority to United States Provisional Application No. 63/180,645, filed Apr. 27, 2021, the entire disclosure of which is hereby incorporated by reference herein.

TECHNICAL FIELD

Embodiments of the present disclosure pertain to the field of semiconductor devices and semiconductor device manufacturing. More particularly, embodiments of the disclosure relate to methods for reducing distortion of a semiconductor wafer.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Multi-layer films on a semiconductor wafer and the layout of the device can lead to complex wafer bow and in-plane distortion that cannot be easily addressed. Often times, lack of being able to address wafer bow and in-plane distortion limits the adoption of some higher-stress films that may have other beneficial properties, such as better etch selectivity and the like.

Accordingly, there is a need for methods of reducing the distortions of a semiconductor wafer to permit scaling required for 3D-NAND, 3D-DRAM, and stacked CMOS devices.

SUMMARY

One or more embodiments of the disclosure are directed to methods of reducing wafer distortion. A blanket film is deposited on a back side of a wafer having at least one field formed on a front side. The at least one field comprises a film, the wafer having a first distortion. A field-level film modification is performed on the blanket film on the back side of the wafer to reduce the wafer distortion to a second distortion less than the first distortion.

Additional embodiments of the disclosure are directed to methods of reducing film stress. A first surface profile of a film on a wafer is measured. The wafer has a front side and a back side. The film is formed on the front side. The measured first surface profile is decomposed into principal-components comprising a low frequency component and a high frequency component. A blanket film is deposited on the back side of the wafer to compensate for the low frequency component of the first measured surface profile. One or more of ions or photons are implanted into the back side of the wafer to compensate for the high frequency component.

Further embodiments of the disclosure are directed to processing tools comprising a metrology station, a blanket film deposition station, a field-level film modification station and a controller. The controller is configured to determine blanket deposition conditions and field-level film modification conditions to reduce wafer distortion from a first distortion to a second distortion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
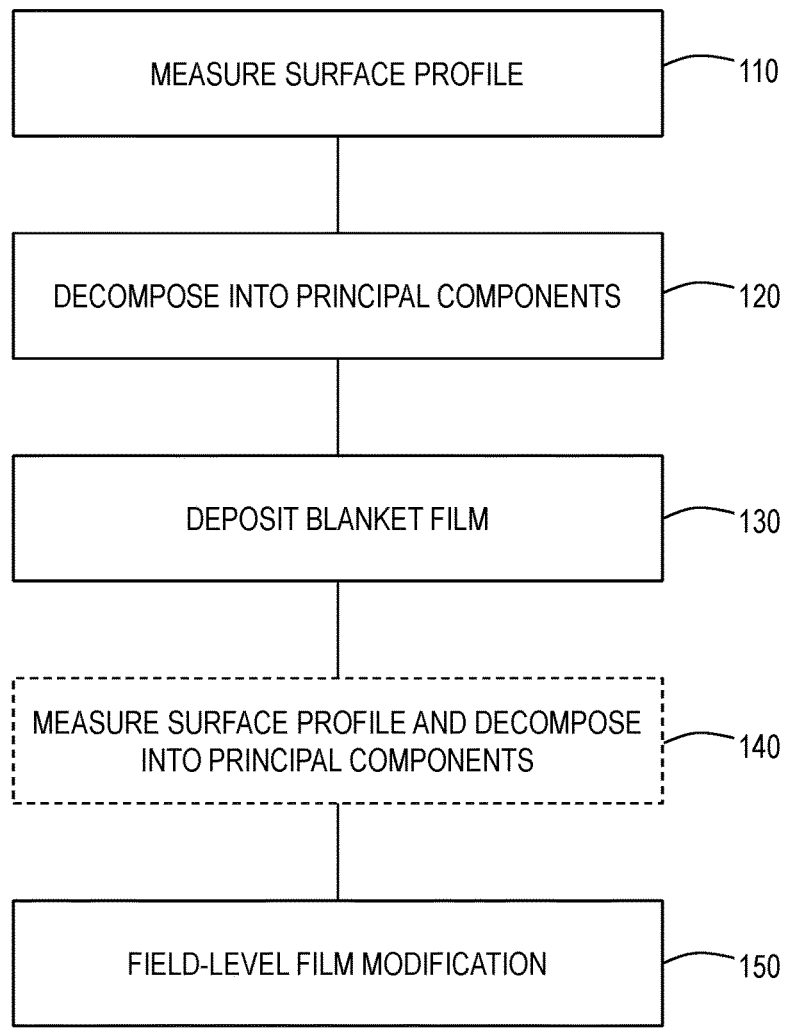
FIG. 1 illustrates a flowchart of a method for reducing wafer distortion according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" or "wafer" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" or "wafer" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Semiconductor devices utilize multi-layer stacks and films on a wafer. The multi-layer stacks and films have varying levels of stress, which lead to considerable strain/bow on the wafer. Such stain/bow on the wafer can create problems both in chucking of the wafer as well as overlay issues between patterning steps and reducing device yield. One or more embodiments advantageously provide a solution to compensate for both wafer bow and in-plane distortion, thus leading to better overlay and device yield.

In one or more embodiments, simple axisymmetric bow geometries resulting from processing on the front side of the wafer are compensated for with annealing and/or back side deposition of films with tunable stress. For more complicated bow geometries, a masking arrangement can be used for the back side films. This, however, might require additional back side planarization steps before further lithography steps.

One or more embodiments of the disclosure are directed to a process that significantly changes the state of stress (and resulting strain) on the wafer. In one or more embodiments, a wafer map of a free-standing wafer is created using available metrology tools. The wafer map is then converted into a power spectral density (PSD) using a spatial frequency scale. The fundamental component of bow is then compensated with a reasonably "uniform" film, e.g., silicon nitride (SiN), deposited on the back side of the wafer.

Wafer bow is typically low-spatial frequency with a large amplitude in strain. In-plane distortion has been compensated to a certain level during lithography, but has limitations on both amplitude and spatial frequency of corrections. In one or more embodiments, films are deposited on the back side of the wafter to address low spatial frequency. A scanning treatment (with lasers or implants) is then used to address high spatial frequencies.

In one or more embodiments, a film is deposited on the back side of the wafer using physical vapor deposition (PVD). As used herein, the term "physical vapor deposition (PVD)" refers to refers to a variety of vacuum deposition methods. Physical processes such as sputtering and evaporation are used in PVD to generate a vapor, in the form of atoms, molecules, or ions, of the coating material supplied from a target. They are then transported to and deposited on the substrate surface, resulting in coating formation. In PVD processes, the substrate temperature is substantially lower than the melting temperature of the target material, making it feasible to coat temperature-sensitive materials. PVD methods used vacuum deposition in which the coating is deposited over the entire wafer surface simultaneously. In some embodiments, the film is deposited on the back side of the wafer using one or more of atomic layer deposition (ALD), plasma-enhanced atomic layer deposition (PEALD), chemical vapor deposition (CVD) or plasma-enhanced chemical vapor deposition (PECVD).

In one or more embodiments, PVD is used to deposit a film on the back side of the wafer to ensure stress retention even after thermal treatments. Any suitable material known to the skilled artisan may be deposited. In one or more embodiments, a nitride film is formed on the back side of the wafer. In specific embodiments, a silicon nitride (SiN) film is formed on the back side of the wafer. In some embodiments, the film formed on the back side of the wafer comprises one or more of an oxide, nitride or oxynitride.

FIG. 1 is a flowchart of a method 100 of reducing film stress in accordance with one or more embodiments of the disclosure. As used herein, film stress refers to the film deposited on the front side of a wafer. A film under a uniform compressive stress would distort the wafer into a bowl shape. A film under a uniform tensile stress would distort the wafer into an umbrella shape. By relieving the wafer distortion, the film stress will become more neutral. Accordingly, the method of reducing film stress is also a method of reducing wafer distortion.

Figure 2A:
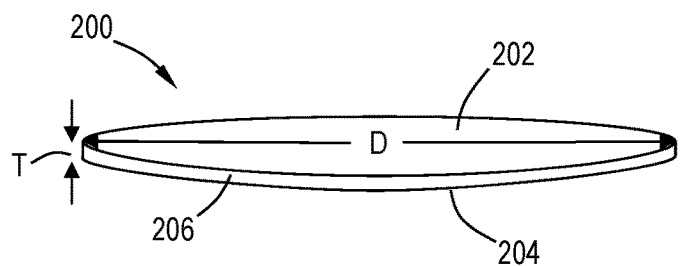
FIG. 2A illustrates a wafer for use with embodiments of the disclosure.

In process 110, a substrate or wafer surface profile is measured. FIG. 2A shows typical wafer 200 for use with embodiments of the disclosure. The wafer 200, or substrate, has a front side 202 and a back side 204 that define a thickness T of the wafer 200. The wafer 200 includes an outer peripheral edge 206 defining a diameter D of the wafer 200. In some embodiments, the wafer has a thickness T in the range of 0.25 mm to 1.5 mm, or in the range of 0.5 mm to 1.25 mm, or in the range of 0.75 mm to 1.0 mm. In some embodiments, the wafer has a diameter D of about 100 mm, 200 mm or 300 mm.

Figure 2B:
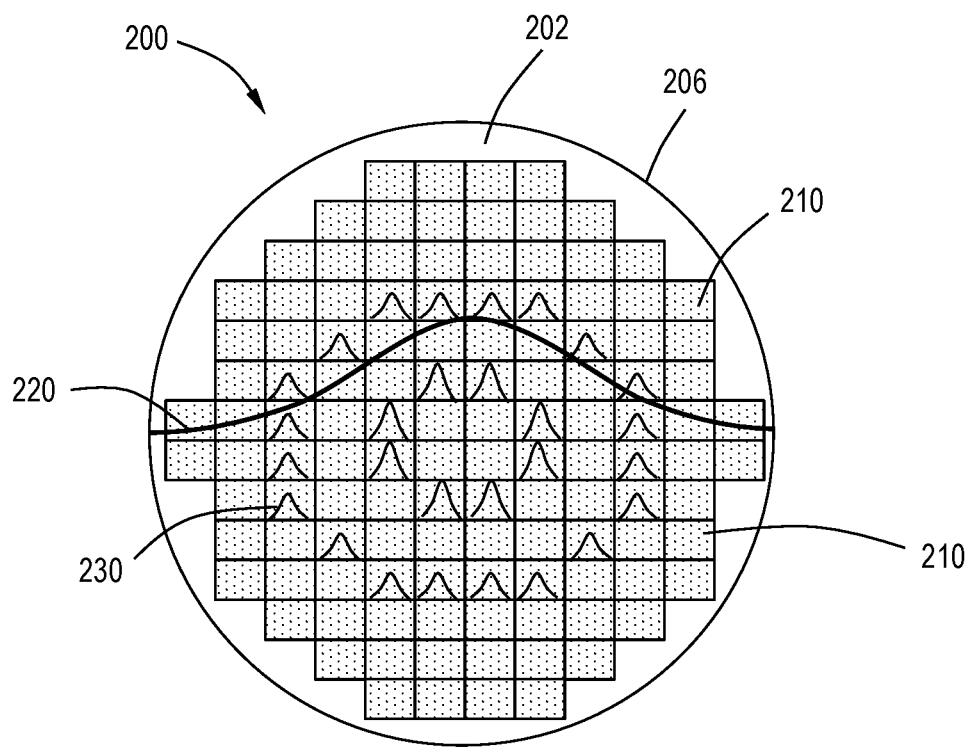
FIG. 2B illustrates a front surface of a wafer with low frequency and high frequency distortion components according to one or more embodiment of the disclosure.

FIG. 2B shows a view of the front side 202 of a wafer 200 with a plurality of fields 210 illustrated as rectangular shapes. The fields 210 are discrete regions on the wafer 200 resulting from patterning and deposition processes. The wafer 200 of some embodiments comprises a front side 202 with a plurality of fields 210 formed thereon.

The first surface profile of the film on the wafer 200 can be measured by any suitable technique known to the skilled artisan. In some embodiments, the wafer 200 surface profile is measured in a metrology station of a processing chamber. The first surface profile is a measure of the degree of curvature of the wafer resulting from, at least, the prior processing conditions and films.

The first surface profile provides a measure of surface variability and includes at least two principal components. The first of the principal components is the low frequency component 220 illustrated in FIG. 2B. The low frequency component 220 is the component that is often most visible as it acts across a large portion of the wafer 200. For example, the low frequency component 220 show represents a tensile film stress resulting in an umbrella shaped distortion. The second component is the high frequency principal component 230, also referred to as the field-level component. The high frequency principal component 230 occurs within the individual fields 210, resulting in a greater number—high frequency—of individual distortions. The overall distortion of the wafer 200 is a result of the combination of the low frequency component 220 and the high frequency component 230.

Accordingly, at process 120, the measured first surface profile is decomposed into principal components comprising a low frequency component 220 and a high frequency component 230. Decomposing the principal components may also be referred to as a principal component deconvolution.

In one or more embodiments, the power spectral density (PSD) is filtered with the strain transfer characteristic of the PVD film, and the residual is mostly higher spatial frequency. This is then used to compute the profile of a scanned sub-aperture beam (of ions, or photons, or other energy source) on the backside of the wafer. This scanned beam imparts a high-spatial-frequency stress component by either locally melting or distorting the lattice structure.

Based on the low frequency component 220 of the measured first surface profile, a blanket deposition process is developed. The blanket film is deposited 130 on the back side 204 of the wafer 200 to counteract or compensate for the low frequency component of the film stress on the front side 202 of the wafer 200.

The blanket deposition conditions are determined based on, for example, the film(s) deposited on the front side 202 of the wafer 200. Blanket deposition parameters that are considered include, but are not limited to, deposition temperature, pressure, film thickness and composition. In some embodiments, the blanket film 130 is deposited to a thickness in the range of 10 nm to 200 nm, or in the range of 20 nm to 180 nm, or in the range of 30 nm to 160 nm, or in the range of 40 nm to 140 nm.

In some embodiments, the blanket film 130 is deposited by physical vapor deposition (PVD). In some embodiments, the blanket film 130 is deposited by chemical vapor deposition (CVD). In some embodiments, the blanket film 130 comprises a silicon-containing film. In some embodiments, the blanket film 130 comprises silicon nitride. In some embodiments, the blanket film 130 is deposited at a temperature in the range of 100 C to 500 C.

The blanket film 130 deposition is used to counteract the stress induced curvature of the wafer from the front surface film. In some embodiments, the first distortion (before blanket film 130 deposition) is a paraboloid shape. In some embodiments, the paraboloid shape turns upward at the edges resulting in a bowl appearance due to compressive stress of the film on the front surface 202. In embodiments with a bowl-shaped principal component, the blanket film deposited is under compressive stress to counteract compressive stress of the film on the front surface. Stated differently, the blanket film is deposited to reduce the degree of compressive stress on the wafer from the film on the front surface.

In some embodiments, the paraboloid shape turns downward at the edges resulting an umbrella appearance due to tensile stress of the film on the front surface 202. In embodiments with an umbrella-shaped principal component, the blanket film deposited on the back side is under tensile stress to counteract the tensile stress of the film on the front surface. Stated differently, the blanket film is deposited to reduce the degree of tensile stress on the wafer from the film on the front surface.

In some embodiments, after blanket film deposition 130, the wafer is subjected to a second surface profile measurement 140. The second surface profile measurement of some embodiments occurs at a lower sampling rate that the first surface profile measurement. The second surface profile measurement is then decomposed or deconvoluted into the principal components. The second profile measurement 140 is an optional process included in some embodiments of the method 200.

In some embodiments, the first surface profile is used to determine both the low frequency component and high frequency component of the film stress. In embodiments of this sort, the wafer is exposed to a field-level film modification process 150. As used in this manner, the term field-level film modification refers to a process that is configured to reduce the wafer distortion due to the high frequency principal component which is generally related to the plurality of fields on the front surface.

Figure 3:
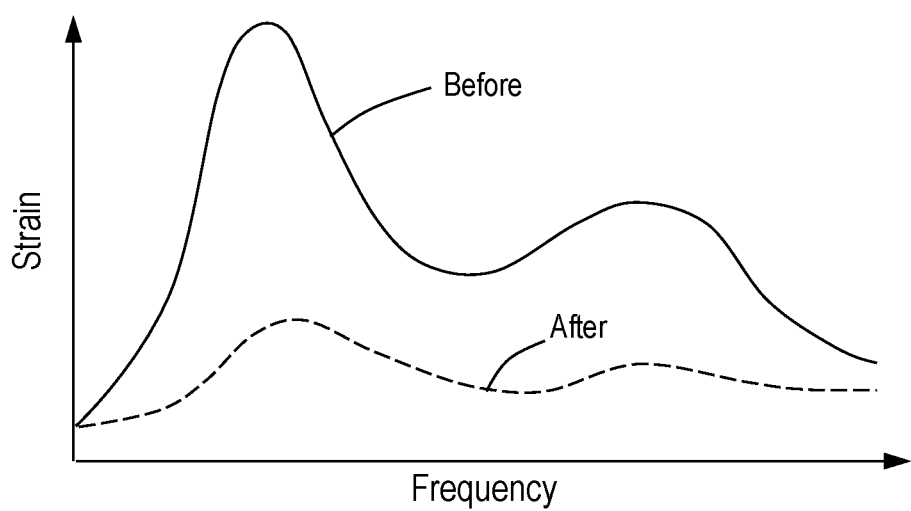
FIG. 3 illustrates a stress-frequency profile of an exemplary wafer before and after the method of FIG. 1.

In some embodiments, the field-level film modification of the blanket film on the back side of the wafer reduces the wafer distortion to a second distortion that is less than the first distortion. In some embodiments, the first distortion is greater than 0.5 mm, 0.6 mm 0.7 mm, 0.8 mm, 0.9 mm or 1 mm across the diameter of the wafer. In some embodiments, the second distortion is less than 1 mm, 0.9 mm, 0.8 mm, 0.7 mm, 0.6 mm, 0.5 mm or 0.4 mm across the diameter of the wafer. FIG. 3 illustrates an exemplary strain/frequency graph showing decreases in both the low frequency and high frequency strain components.

The high frequency principal component, also referred to as the field-level component, is related to the number of individual fields on the front surface. In some embodiments, there are in the range of 100 to 400 fields on the front side of the wafer. In some embodiments, each of the fields has a width in the range of 10 mm to 30 mm. In some embodiments, each of the fields has a length in the range of 20 mm to 50 mm.

The high frequency principal component, whether from the first surface profile or a second surface profile, is used to determine a modification profile. In some embodiments, the field-level modification 150 comprises an implantation process comprising one or more of photons or ion implantation. A dose map of the wafer is determined based on the high frequency principal component.

In some embodiments, the field-level modification comprises exposing the back side of the wafer to ions in a predetermined pattern (from the dose map). In some embodiments, the field-level modification comprises exposing the back side of the wafer to photons in a predetermined pattern (from the dose map). In some embodiments, implanting ions and/or photons in the blanket film on the back side of the wafer compensates for the high frequency component.

Figure 4:
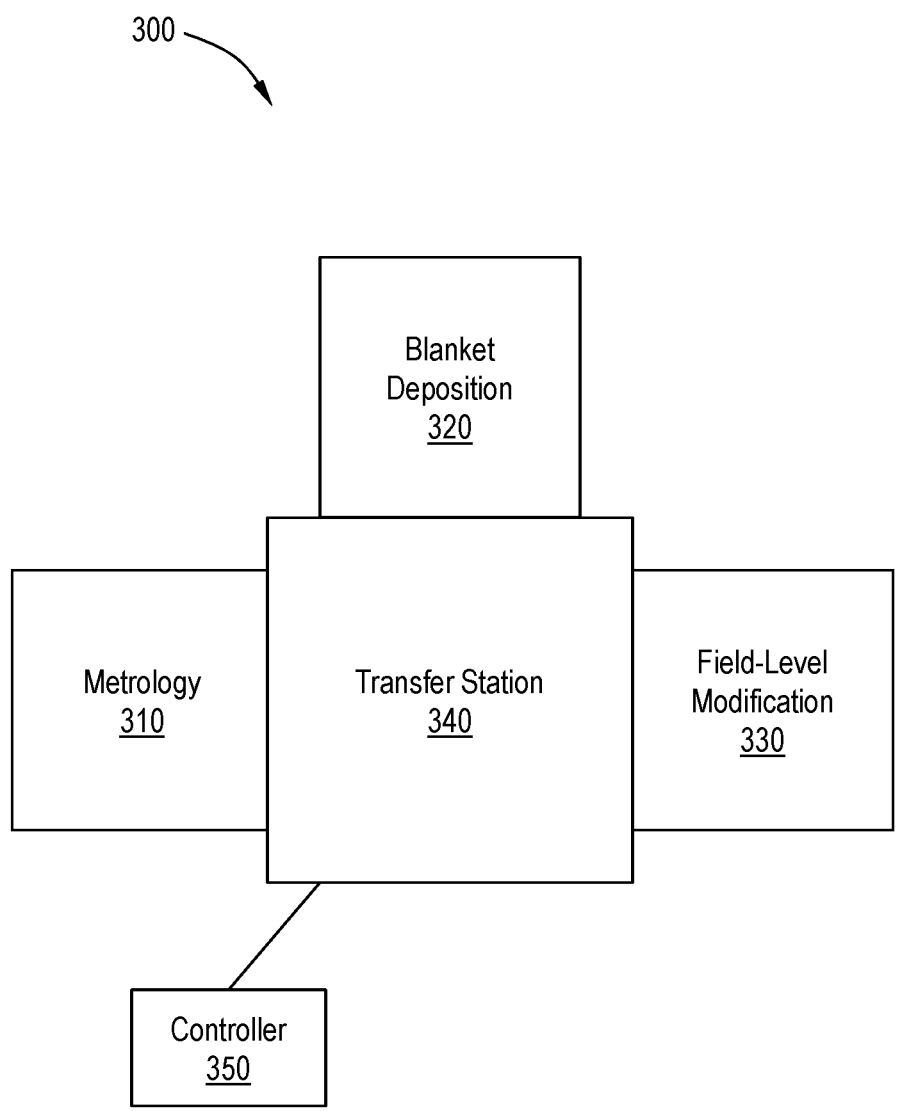
FIG. 4 illustrates a processing tool in accordance with one or more embodiment of the disclosure.

Additional embodiments of the disclosure are directed to processing tools 300, as illustrated in FIG. 4. The processing tool 300 comprises a metrology station 310, a blanket deposition station 320 and a field-level modification station 330. In the illustrated embodiment the metrology station 310, blanket deposition station 320 and field-level modification station 330 are connected to a central transfer station 340. In some embodiments, not all of the metrology, blanket deposition and field-level modification stations are connected directly to the central transfer station.

The illustrated embodiment has separate stations for metrology, blanket deposition and field-level modification. In some embodiments, one or more of the metrology, blanket deposition or field-level modification stations are combined into a single component.

The processing tool 300 of some embodiments further comprises a controller 350 configured to determine blanket deposition conditions and field-level film modification conditions to reduce wafer distortion from a first distortion to a second distortion. The controller 350 illustrated is connected to the central transfer station 340. However, the skilled artisan will recognize that the controller can be connected to any or all of the components of the processing tool. In some embodiments, there is more than one controller, with each controller configured to perform some or all of the method.

In some embodiments, the controller 350 is further configured to decompose a first surface profile measurement of a film on a front side of a wafer from the metrology station into principal components comprising a low frequency component and a high frequency component, and perform a blanket deposition on a back side of a wafer in the blanket deposition station. In some embodiments, the controller is further configured to decompose a second surface profile measurement of the film on the front side of the wafer after blanket deposition into a low frequency component and high frequency component. In some embodiments, the controller is further configured to perform an implantation process in the field-level film modification station to compensate for the high frequency component of the second surface profile measurement.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principals and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of reducing wafer distortion, the method comprising:
    creating a wafer map of a wafer having at least one field formed on a front side, the at least one field comprising a film, and using a spatial frequency scale to convert the wafer map into a power spectral density (PSD);
    depositing a blanket film on a back side of the wafer to reduce wafer distortion to a first distortion; and
    using the PSD to perform a field-level film modification of the blanket film on the back side of the wafer to reduce the wafer distortion to a second distortion less than the first distortion.

2. The method of claim 1, wherein the blanket film has a thickness in a range of from 10 nm to 200 nm.

3. The method of claim 1, wherein depositing the blanket film comprises physical vapor deposition of a material.

4. The method of claim 3, wherein the material comprises silicon nitride (SiN).

5. The method of claim 1, wherein the first distortion is paraboloid in shape.

6. The method of claim 1, wherein the blanket film is under compressive stress.

7. The method of claim 1, wherein the blanket film is under tensile stress.

8. The method of claim 1, wherein the blanket film is deposited at a temperature in a range of from 100° C. to 500° C.

9. The method of claim 1, wherein performing the field-level film modification comprises exposing the back side of the wafer to ions in a predetermined pattern, the predetermined pattern determined by filtering the power spectral density (PSD) with a strain transfer characteristic of the blanket film to provide a residual PSD.

10. The method of claim 1, wherein performing the field-level film modification comprises exposing the back side of the wafer to photons in a predetermined pattern, the predetermined pattern determined by filtering the power spectral density (PSD) with a strain transfer characteristic of the blanket film to provide a residual PSD.

11. The method of claim 1, wherein there are in the range of 100 to 400 fields on the front side of the wafer.

12. The method of claim 11, wherein each of the fields is in the range of 10 mm to 30 mm wide.

13. The method of claim 11, wherein each of the fields is in the range of 20 mm to 50 mm long.

* * * * *